US012700841B2

(12) United States Patent
Kumagai et al.

(10) Patent No.: US 12,700,841 B2
(45) Date of Patent: Aug. 4, 2026

(54) RECEIVER CIRCUIT AND OPTICAL RECEIVER CIRCUIT

(71) Applicant: SUMITOMO ELECTRIC INDUSTRIES, LTD., Osaka (JP)

(72) Inventors: Seiji Kumagai, Osaka (JP); Yoshiyuki Sugimoto, Osaka (JP); Keiji Tanaka, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 454 days.

(21) Appl. No.: 18/527,880

(22) Filed: Dec. 4, 2023

(65) Prior Publication Data

US 2024/0195370 A1      Jun. 13, 2024

(30) Foreign Application Priority Data

Dec. 8, 2022    (JP) ................................. 2022-196049

(51) Int. Cl.
*H03F 3/45* (2006.01)
*H03G 3/30* (2006.01)
(52) U.S. Cl.
CPC ..... *H03F 3/45085* (2013.01); *H03F 3/45174* (2013.01); *H03F 3/456* (2013.01); *H03G 3/30* (2013.01); *H03F 2203/45116* (2013.01)
(58) Field of Classification Search
None
See application file for complete search history.

(56) References Cited

U.S. PATENT DOCUMENTS

| 8,150,272 B2 * | 4/2012 | Ossieur ................ H04B 10/272 |
| | | 250/214 AG |
| 11,736,069 B2 * | 8/2023 | Liu ........................... H03F 1/14 |
| | | 330/277 |
| 2014/0028400 A1 * | 1/2014 | Suzuki ................ H03F 3/45475 |
| | | 333/32 |

FOREIGN PATENT DOCUMENTS

JP          H10-224162          8/1998

* cited by examiner

*Primary Examiner* — Andrea Lindgren Baltzell
*Assistant Examiner* — Malane Lieng
(74) *Attorney, Agent, or Firm* — IPUSA, PLLC

(57) ABSTRACT

A receiver circuit includes: a constant current circuit to generate second paired current signals according to first paired current signals; a current splitter circuit to output third paired current signals generated from the second paired current signals, from a first output node and a second output node; and a differential TIA circuit to output paired voltage signals from a first output terminal and a second output terminal, according to the third paired current signals input from a third input node and a fourth input node. The differential TIA circuit includes a first feedback resistor element connected between the third input node and the second output terminal, and a second feedback resistor element connected between the fourth input node and the first output terminal. Average voltages of the first and second output nodes and the first and second output terminals are set to be equivalent to each other.

8 Claims, 9 Drawing Sheets

Lp　Vpd

PDP

100

INP ipdp

OUTP voutp

RECEIVER CIRCUIT

Ln

INN ipdn

PDN

Vpd

OUTN voutn

Legend:

— ·· — ·· — Gain High, Icbp

— · — · — · Gain High, Icbn

———— Gain Mid, Icbp

— — — Gain Mid, Icbn

- - - - - - Gain Low, Icbp

— — — — Gain Low, Icbn

RECEIVER CIRCUIT AND OPTICAL RECEIVER CIRCUIT

CROSS-REFERENCE TO RELATED APPLICATION

The present application is based upon and claims priority under 35 U.S.C. § 119 to Japanese Patent Application No. 2022-196049 filed on Dec. 8, 2022, the entire contents of which are incorporated herein by reference.

TECHNICAL FIELD

The present disclosure relates to a receiver circuit and an optical receiver circuit.

BACKGROUND

Conventionally, as a variable gain amplifier circuit, a circuit using a Gilbert circuit has been known (see, e.g., Japanese Laid-Open Patent Application No. H10-224162).

SUMMARY

The present disclosure provides a receiver circuit that includes:
a constant current circuit that includes
a first input node and a second input node into which first paired current signals are input,
a first current source connected to the first input node, and
a second current source connected to the second input node, wherein the receiver circuit is configured to generate second paired current signals according to the first paired current signals;
a current splitter circuit configured to generate third paired current signals from the second paired current signals, wherein the current splitter circuit includes a first output node and a second output node configured to output the third paired current signals, and sets an amplitude of the third paired current signals to be smaller than an amplitude of the second paired current signals, by adding an inverted split signal and a non-inverted split signal split from the second paired current signals according to a first control voltage and a second control voltage together;
a load circuit that includes a first load resistor element and a second load resistor element, wherein the first load resistor element is connected to the first output node and the second load resistor element is connected to the second output node;
a differential transimpedance amplifier circuit that includes
a third input node and a fourth input node into which the third paired current signals are input,
a first output terminal and a second output terminal configured to output paired voltage signals,
a first feedback resistor element connected between the third input node and the second output terminal, and
a second feedback resistor element connected between the fourth input node and the first output terminal,
wherein the differential transimpedance amplifier circuit is configured to generate the paired voltage signals according to the third paired current signals, and wherein average voltages of the first output node, the second output node, the first output terminal, and the second output terminal are set to be equivalent to each other.

BRIEF DESCRIPTION OF THE DRAWINGS

FIG. 1 is a diagram illustrating an example of a configuration of an optical receiver circuit according to an embodiment.

DETAILED DESCRIPTION

Description of Embodiments of Present Disclosure

Figure 2:
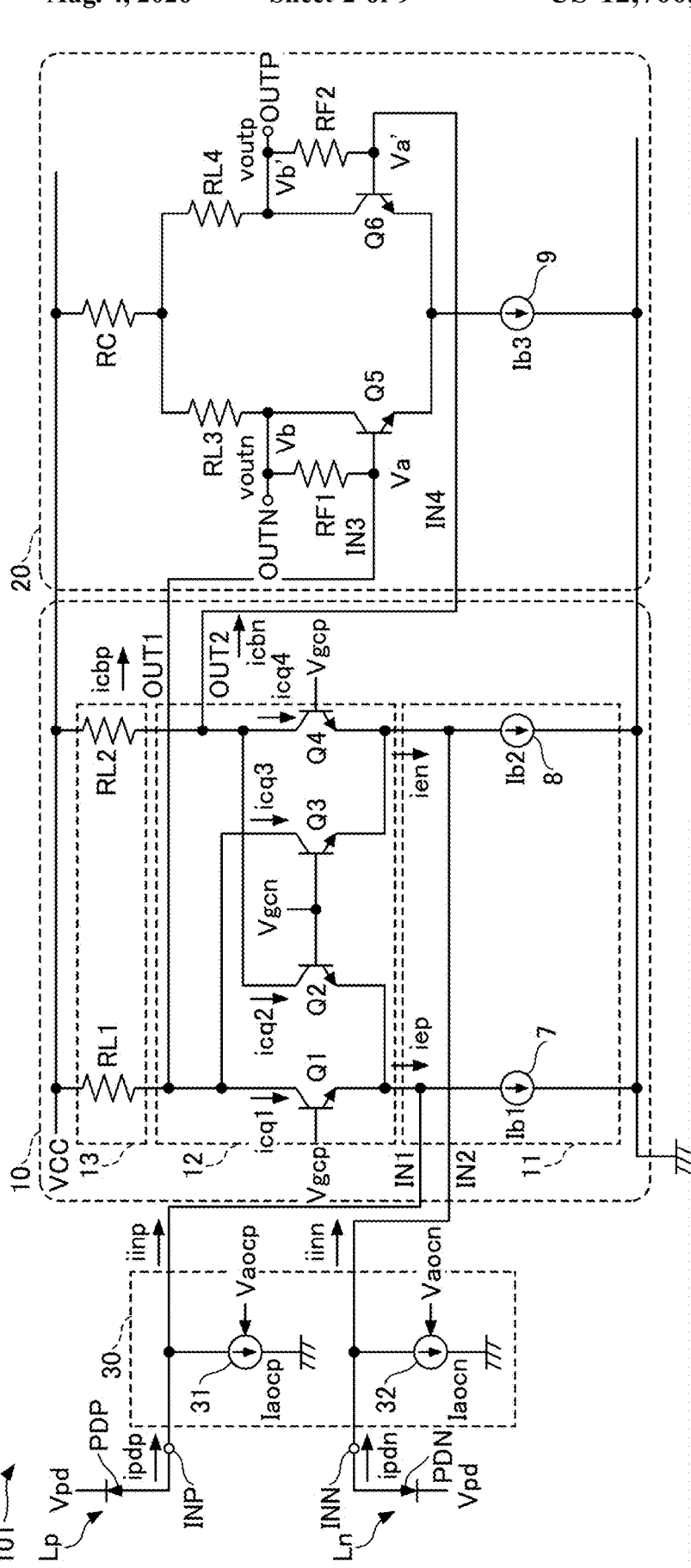
FIG. 2 is a diagram illustrating an example of a configuration of a receiver circuit according to a first embodiment.

In a digital coherent optical transmission scheme being used for long-distance optical communication, performance of amplifying an electric signal without distortion is required upon converting an optical signal into the electric signal in a wide optical input power range. Many receiver circuits have a variable gain mechanism to meet this requirement.

However, when the gain is varied, there may be cases where the frequency characteristics of the gain fluctuate. The fluctuation in the frequency characteristics may cause distortion of the electric signal.

The present disclosure provides a receiver circuit and an optical receiver circuit that can reduce the fluctuation in the frequency characteristics when changing the gain.

According to the present disclosure, the fluctuation in the frequency characteristics when changing the gain can be reduced.

First, embodiments in the present disclosure will be enumerated and described.

(1) According to the present disclosure, a receiver circuit includes
a constant current circuit that includes
a first input node and a second input node into which first paired current signals are input,
a first current source connected to the first input node, and
a second current source connected to the second input node, wherein the receiver circuit is configured to generate second paired current signals according to the first paired current signals;
a current splitter circuit configured to generate third paired current signals from the second paired current signals, wherein the current splitter circuit includes a first output node and a second output node configured to output the third paired current signals, and sets an amplitude of the third paired current signals to be smaller than an amplitude of the second paired current signals, by adding an inverted split signal and a non-inverted split signal split from the second paired current signals according to a first control voltage and a second control voltage together;

a load circuit that includes a first load resistor element and a second load resistor element, wherein the first load resistor element is connected to the first output node and the second load resistor element is connected to the second output node;

a differential transimpedance amplifier circuit that includes a third input node and a fourth input node into which the third paired current signals are input, a first output terminal and a second output terminal configured to output paired voltage signals, a first feedback resistor element connected between the third input node and the second output terminal, and a second feedback resistor element connected between the fourth input node and the first output terminal, wherein the differential transimpedance amplifier circuit is configured to generate the paired voltage signals according to the third paired current signals, and wherein average voltages of the first output node, the second output node, the first output terminal, and the second output terminal are set to be equivalent to each other.

According to (1), the average voltages of the first output node, the second output node, the first output terminal, and the second output terminal are set to be equivalent to each other. Accordingly, deviation from the optimum value of the operating point of the differential transimpedance amplifier circuit is suppressed, and thereby, a receiver circuit that can reduce the fluctuation in the frequency characteristics when changing the gain can be provided.

(2) In the receiver circuit of (1),
the first current source supplies a first current,
wherein the second current source supplies a second current,
wherein the second current has a current value that is equivalent to a current value of the first current,
wherein the second load resistor element has a resistance value equivalent to a resistance value of the first load resistor element,
wherein the differential transimpedance amplifier circuit further includes a third current source, a third load resistor element, and a fourth load resistor element,
wherein the third current source supplies a third current,
wherein the fourth load resistor element has a resistance value equivalent to a resistance value of the third load resistor element, and
wherein the third current is equivalent to a sum of an average current flowing through the third load resistor element and an average current flowing through the fourth load resistor element.

According to (2), the third current is equivalent to the sum of the average current flowing through the third load resistor element and the average current flowing through the fourth load resistor element. Accordingly, deviation from the optimum value of the operating point of the differential transimpedance amplifier circuit is further suppressed, and thereby, the fluctuation in the frequency characteristics when changing the gain can be further reduced.

(3) In the receiver circuit of (2),
the differential transimpedance amplifier circuit further includes a fifth load resistor element, and
wherein the fifth load resistor element has one end connected to the third load resistor element and the fourth load resistor element, and has another end connected to a power supply wire.

According to (3), the fifth load resistor element has its one end connected to the third load resistor element and the fourth load resistor element, and has the other end connected to the power supply wire. Accordingly, the voltage of the first output terminal and the second output terminal can be set to desired values by the resistance value of the fifth load resistor element.

(4) The receiver circuit of any one of (1) to (3) may further include a first input terminal into which a first current signal is input;

an second input terminal into which a second current signal is input; and a current pull-out circuit configured to generate the first paired current signals by pulling out a first direct current from the first current signal and pulling out a second direct current from the second current signal.

According to (4), the direct current component included in the first paired current signals is reduced. Accordingly, deviation from the optimum value of voltage is suppressed at the first output node and the second output node, and thereby, the fluctuation in the frequency characteristics when changing the gain can be more reduced.

(5) The receiver circuit of (4) may further include
a reference voltage circuit configured to generate a reference voltage; and a feedback control circuit configured to control pulling out the first direct current and the second direct current so as to make a voltage of the third input node and a voltage of the fourth input node equivalent to the reference voltage.

According to (5), the voltage of the third input node and the voltage of the fourth input node are equivalent to the reference voltage, and thereby, the fluctuation in the frequency characteristics when changing the gain can be more reduced.

(6) In the receiver circuit of (5),
the first current source includes a first transistor configured to supply the first current, wherein the second current source includes a second transistor configured to supply the second current, wherein the current splitter circuit includes a fourth transistor connected to a collector of the first transistor and a fifth transistor connected to a collector of the second transistor, and wherein the reference voltage circuit includes a sixth transistor whose base is connected to bases of the first transistor and the second transistor, and a seventh transistor connected to a collector of the sixth transistor.

According to (6), the connection configuration of the reference voltage circuit matches the connection configuration of the constant current circuit and the split current circuit. Accordingly, according to fluctuations in temperature or power supply voltage, movement of the voltage at the third input node and the voltage at the fourth input node is matched with the movement of the reference voltage. As a result, compensation operations can be precisely executed for fluctuations in temperature or power supply voltage, and thereby, the fluctuation in the frequency characteristics when changing the gain can be more reduced.

(7) The receiver circuit of any one of (2) to (6) further includes a reference current circuit configured to generate a reference current, wherein the first current source includes a first transistor configured to supply the first current, wherein the second current source includes a second transistor configured to supply the second current, wherein the third current source includes a third transistor configured to supply the third current, and wherein the reference current circuit supplies currents to bases of the first transistor, the second transistor, and the third transistor so as to make changes in the first current, the second current, and the third current with respect to temperature or power supply voltage, equivalent to change in the reference current with respect to the temperature or the power supply voltage.

According to (7), the respective average voltages of the first output node, the second output node, the first output terminal, and the second output terminal are adjusted to be equivalent to each other, and thereby, the fluctuation in the frequency characteristics when changing the gain can be more reduced.

(8) According to the present disclosure, an optical receiver circuit includes a first photodetector element configured to generate a first current signal according to a first optical signal;

a second photodetector element configured to generate a second current signal according to a second optical signal; and the receiver circuit as described in any of (1) to (7) that includes a first input terminal to which the first photodetector element is connected, and a second input terminal to which the second photodetector element is connected.

According to (8), the receiver circuit described in any one of (1) through (7) is provided, and thereby, the optical receiver circuit that can reduce the fluctuation in the frequency characteristics when changing the gain can be provided.

Details of Embodiments in Present Disclosure

Specific examples of receiver circuits and optical receiver circuits in the present disclosure will be described below with reference to the drawings. Note that the present invention is not limited to these exemplifications, and it is intended to cover matters implied by the claims and all changes within the meaning and scope of the claims and equivalence.

Figure 1:
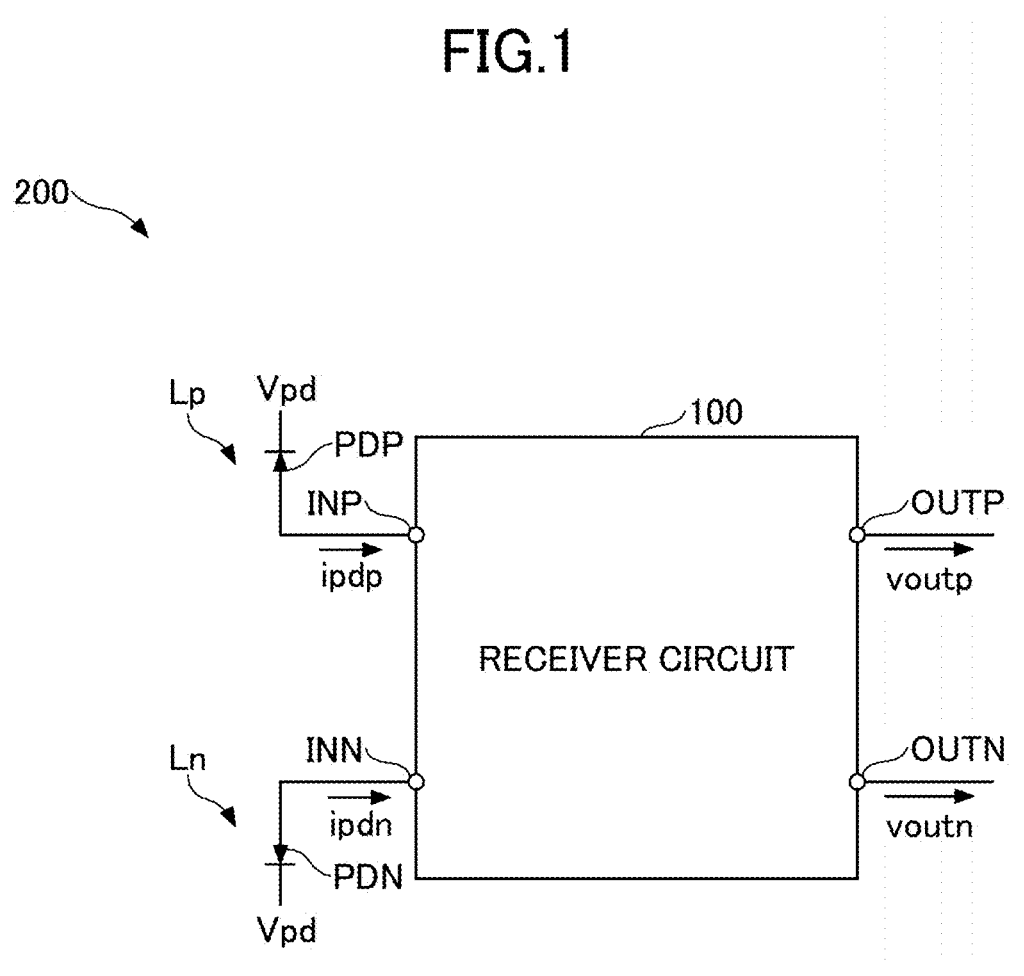

FIG. 1 is a diagram illustrating an example of a configuration of an optical receiver circuit according to an embodiment. An optical receiver circuit 200 illustrated in FIG. 1 generates paired voltage signals voutp and voutn according to a first optical signal Lp and a second optical signal Ln. The pair of first optical signal Lp and second optical signal Ln are optical signals having phases inverted from each other; for example, the first optical signal Lp is the positive-phase component of the differential light signal, and the second optical signal Ln is the reversed-phase component of the differential light signal. For example, as the intensity of the first optical signal Lp becomes greater, the intensity of the second optical signal Ln becomes smaller, and as the intensity of the first optical signal Lp becomes smaller, the intensity of the second optical signal Ln becomes greater. In addition, when the intensity of the first optical signal Lp reaches a maximum value (peak value), the intensity of the second optical signal Ln reaches a minimum value (bottom value), and when the intensity of the first optical signal Lp reaches a bottom value, the intensity of the second optical signal Ln reaches a peak value. It is favorable that the second optical signal Ln has a maximum amplitude whose magnitude is equivalent to the maximum amplitude of the first optical signal Lp, and has an average value whose magnitude is equivalent to the time average (average value) of the first optical signal Lp. In this way, the first optical signal Lp and the second optical signal Ln form a pair of complementary signals. The pair of complementary signals may be treated as a differential signal which has an intensity equivalent to a difference between the intensities of the complementary signals. For example, when the intensity of the first optical signal Lp has the peak value and the intensity of the second optical signal Ln has the bottom value, the differential signal may be configured to have a binary data "1". Reversely, when the intensity of the first optical signal Lp has the bottom value and the intensity of the second optical signal Ln has the peak value, the differential signal may be configured to have a binary data "0". Thus, the differential signal is transmitted using the pair of the complementary signals.

In the following description, in the case of a differential signal transmitted using a positive-phase component and a reverse-phase component, the positive-phase component and the reversed-phase component have substantially the same characteristics as the first optical signal Lp and the second optical signal Ln described above, respectively. For example, the paired voltage signals voutp and voutn may be treated as a differential voltage signal, which includes the voltage signal voutp as the positive-phase component and the voltage signal voutn as the reversed-phase component and has an amplitude equivalent to a difference between the voltage signal Voutp and the voltage signal Voutp. The differential voltage signal is transmitted using the paired voltage signals voutp and voutn.

The optical receiver circuit 200 is installed, for example, on a receiver of a digital coherent optical transmission scheme. The optical receiver circuit 200 includes a first photodetector element PDP, a second photodetector element PDN, and a receiver circuit 100. The first photodetector element PDP generates and outputs a first current signal ipdp according to the first optical signal Lp. The second photodetector element PDN generates and outputs a second current signal ipdn according to the second optical signal Ln.

The first photodetector element PDP and the second photodetector element PDN are, for example, a pair of photodetector elements. It is favorable that the second photodetector element PDN has, for example, the same electric and optical characteristics as the electric and optical characteristics of the first photodetector element PDP. For example, the first photodetector element PDP may be formed of the same material as the second photodetector element PDN so as to have the same structure.

The first photodetector element PDP receives the first optical signal Lp, and generates a first current signal ipdp. The first photodetector element PDP receives the first optical signal Lp, and outputs the first current signal ipdp whose current value is greater as the signal intensity of the received first optical signal Lp is greater. In addition, the first photodetector element PDP outputs the first current signal ipdp whose current value is smaller as the signal intensity of the received first optical signal Lp is smaller. The first photodetector element PDP outputs the first current signal ipdp whose current amplitude changes according to change in amplitude of the signal intensity of the first optical signal Lp. The first photodetector element PDP is, for example, a photodiode. The first photodetector element PDP has a cathode to which a bias voltage Vpd is applied, and an anode connected to a first input terminal INP of the receiver circuit 100. The first photodetector element PDP may be, for example, a photodetector element other than a photodiode. For example, in the case where the first photodetector element PDP is a photodiode, it is used in a reverse bias state so as to make the anode voltage lower than the cathode voltage.

The second photodetector element PDN receives the second optical signal Ln, and generates a second current signal ipdn. The second photodetector element PDN receives the second optical signal Ln, and outputs the second current signal ipdn whose current value is greater as the signal intensity of the received second optical signal Ln is greater. In addition, the second photodetector element PDN outputs the second current signal ipdn whose current value is smaller as the signal intensity of the received second optical signal Ln is smaller. The second photodetector element PDN outputs the second current signal ipdn whose current amplitude changes according to change in amplitude of the signal intensity of the second optical signal Ln. The second photodetector element PDN is, for example, a photodiode. The second photodetector element PDN has a cathode to which a bias voltage Vpd is applied, and an anode connected to a second input terminal INN of the receiver circuit 100. The second photodetector element PDN may be, for example, a photodetector element other than a photodiode. For example, in the case where the second photodetector element PDN is a photodiode, it is used in a reverse bias state so as to make the anode voltage lower than the cathode voltage.

The receiver circuit 100 generates the paired voltage signals voutp and voutn according to the first current signal ipdp and the second current signal ipdn. The paired voltage signals voutp and voutn are formed by the first voltage signal voutp and the second voltage signal voutn. For example, the first voltage signal voutp is the positive-phase component of the paired voltage signals voutp and voutn, and the second voltage signal voutn is the reversed-phase component of the paired voltage signals voutp and voutn. The paired voltage signals voutp and voutn may be treated as a differential voltage signal. For example, when the first optical signal Lp and the second optical signal Ln are a pair of complementary signals and their respective phases are inverted, the pair of first current signal ipdp and second current signal ipdn becomes a pair of complementary signals whose respective phases are inverted, and forms a pair of paired current signals. In other words, for example, the first current signal ipdp corresponds to the positive-phase component of the paired current signals, and the second current signal ipdn corresponds to the reversed-phase component of the paired current signals. The second current signal ipdn has a phase 180° different from the phase of the first current signal ipdp. The first current signal ipdp and the second current signal ipdn form a pair of differential input currents ipdp and ipdn. For example, as the value (current value) of the first current signal ipdp becomes greater, the value of the second current signal ipdn becomes smaller, and as the value of the first current signal ipdp becomes smaller, the value of the second current signal ipdn becomes greater. In addition, when the value of the first current signal ipdp reaches a maximum value (peak value), the value of the second current signal ipdn reaches a minimum value (bottom value), and when the value of the first current signal ipdp reaches a bottom value, the value of the second current signal ipdn reaches a peak value. It is favorable that the second current signal ipdn has an amplitude whose magnitude is equivalent to the amplitude of the first current signal ipdp, and has an average value whose magnitude is equivalent to the time average (average value) of the first current signal ipdp. In this way, the first current signal ipdp and the second current signal ipdn form a pair of complementary signals. The pair of complementary signals may be treated as a differential current signal.

The receiver circuit 100 includes the first input terminal INP to which the first photodetector element PDP is connected, and the second input terminal INN to which the second photodetector element PDN is connected.

The first input terminal INP is electrically connected to, for example, the first photodetector element PDP outside the receiver circuit 100. The first input terminal INP receives the first current signal ipdp, for example, from the first photodetector element PDP. For example, in the case where the receiver circuit 100 is formed on a semiconductor chip as an integrated circuit, the first input terminal INP is a pad of the integrated circuit. For example, the first input terminal INP is electrically connected to the anode of the first photodetector element PDP via a bonding wire.

The second input terminal INN is electrically connected to, for example, the second photodetector element PDN outside the receiver circuit 100. The second input terminal INN receives the second current signal ipdn, for example, from the second photodetector element PDN. For example, in the case where the receiver circuit 100 is formed on a semiconductor chip as an integrated circuit, the second input terminal INN is a pad of the integrated circuit. For example, the second input terminal INN is electrically connected to the anode of the second photodetector element PDN via a bonding wire.

FIG. 2 is a diagram illustrating an example of a configuration of a receiver circuit according to a first embodiment. A receiver circuit 101 illustrated in FIG. 2 is an example of the receiver circuit 100 (FIG. 1). The receiver circuit 101 includes a current pull-out circuit 30, a differential amplitude adjuster circuit 10, and a differential TIA circuit 20. TIA is an abbreviation for transimpedance amplifier.

In the current pull-out circuit 30, the first current signal ipdp is input via the first input terminal INP, and the second current signal ipdn is input via the second input terminal INN. The current pull-out circuit 30 pulls out a first direct current (also referred to as the first feedback current Iaocp) from the first current signal ipdp, and pulls out a second direct current (also referred to as the second feedback current Iaocn) from the second current signal ipdn, to generate first paired current signals iinp and iinn. The first paired current signals iinp and iinn may be treated as a first differential current signal. The current pull-out circuit 30 pulls out the first feedback current Iaocp from the first current signal ipdp, to generate the first input current iinp as the positive-phase component of the first paired current signals iinp and iinn. The current pull-out circuit 30 pulls out the second feedback current Iaocn from the second current signal ipdn, to generate the second input current iinp as the reversed-phase component of the first paired current signals iinn and iinn. The first current signal ipdp includes an alternate current component that changes with time for information transmission, and a direct current component (DC component) corresponding to a time-averaged value. By making the magnitude of the first feedback current Iaocp equivalent to the magnitude of the DC component of the first current signal ipdp, the first input current iinp becomes equivalent to the AC component of the first current signal ipdp. In addition, the second current signal ipdn includes an alternate current component that changes with time for information transmission and a DC component corresponding to a time-averaged value. By making the magnitude of the second feedback current Iaocn equivalent to the magnitude of the DC component of the second current signal ipdn, the second input current iinn becomes equivalent to the AC component of the second current signal ipdn.

The current pull-out circuit 30 includes a first pull-out current source 31 that generates the first feedback current Iaocp, and a second pull-out current source 32 that generates the second feedback current Iaocn. The first pull-out current source 31 changes the value of the first feedback current Iaocp according to the value of a first pull-out control voltage (also referred to as the first feedback control voltage Vaocp) to be input. The second pull-out current source 32 changes the value of the second feedback current Iaocn according to the value of a second pull-out control voltage (also referred to as the second feedback control voltage Vaocn) to be input.

Note that in the specific name of a signal, the leading I or i indicates a current. The capital letter I indicates a DC (direct current) current. The lower-case letter i indicates a signal current including an AC (alternate current) component. In either case of a signal current including only the AC component, or case of including an AC component and a DC component, the beginning of the specific name is denoted by the lower-case letter i. In addition, in the specific name of a signal, the leading V or v indicates a voltage. The capital V indicates a DC voltage. The lower-case letter v indicates a signal voltage including an AC component. In either case of a signal voltage including only the AC component, or case of including an AC component and a DC component, the beginning of the specific name is denoted by the lower-case letter v.

The first input current iinp and the second input current iinn that come to include only the AC component by the current pull-out circuit 30 are input into the differential amplitude adjuster circuit 10.

The differential amplitude adjuster circuit 10 includes a constant current circuit 11, a current splitter circuit 12, and a load circuit 13. The current splitter circuit 12 is connected between the load circuit 13 and the constant current circuit 11, and the load circuit 13 is connected between the power supply wire VCC and the current splitter circuit 12. In other words, the constant current circuit 11, the current splitter circuit 12, and the load circuit 13 are connected in series between the power supply wire VCC and a ground wire in this order. The differential amplitude adjuster circuit 10 adjusts the amplitudes of the first paired current signals iinp and iinn, and outputs the amplitude-adjusted paired current signals as third paired current signals icbp and icbn. By adjusting the amplitudes, the ratios of the magnitudes of the third paired current signals ichp and icbn to the magnitudes of the first paired current signals iinp and iinn (current gain) change. The differential amplitude adjuster circuit 10 variably changes the current gain from 0 to 1 according to the first control voltage Vgcp and the second control voltage Vgcn. As the current gain is less than or equal to 1, the amplitudes of the third paired current signals icbp and icbn are equivalent to or smaller than the amplitudes of the first paired current signals iinp and iinn. Therefore, the differential amplitude adjuster circuit 10 attenuates the first paired current signals iinp and iinn, and outputs the attenuated paired current signals as the third paired current signals icbp and ichn. The first input current iinp is input into a first input node IN1 of the constant current circuit 11, and the second input current iinn is input into a second input node IN2 of the constant current circuit 11.

The constant current circuit 11 includes the first input node IN1 and the second input node IN2 to which the first paired current signals iinp and iinn are input, a first current source 7 connected to the first input node IN1, and a second current source 8 connected to the second input node IN2. The first current source 7 is connected between the first input node IN1 and the ground, and supplies a constant first current (also referred to as the first constant current Ib1). The second current source 8 is connected between the second input node IN2 and the ground, and supplies a constant second current (also referred to as the second constant current Ib2). The second constant current Ib2 has a current value that is equivalent to the current value of the first constant current Ib1.

The constant current circuit 11 generates second paired current signals iep and ien according to the first paired current signals iinp and iinn. The second paired current signals iep and ien may be treated as a second differential current signal. The current iep as the positive-phase component of the second paired current signals iep and ien is generated by subtracting the first input current iinp from the first constant current Ib1. The sum of the first input current iinp and the current iep is equivalent to the first constant current Ib1, and hence, for example, as the first input current iinp becomes greater, the current iep becomes smaller, and as the first input current iinp becomes smaller, the current iep becomes greater. In other words, the current iep is an inverted signal of the first input current iinp. The current ien as the reversed-phase component of the second paired current signals iep and ien is generated by subtracting the second input current iinn from the second constant current Ib2. The sum of the second input current iinn and the current ien is equivalent to the second constant current Ib2, and hence, for example, as the second input current iinn becomes greater, the current ien becomes smaller, and as the second input current iinn becomes smaller, the current ien becomes greater. In other words, the current ien is an inverted signal of the second input current iinn. Therefore, the current iep as the positive-phase component and the current ien as the reversed-phase component of the second paired current signals iep and ien are inverted for the positive-phase component (first input current iinp) and the reversed-phase component (second input current iinn) of the first paired current signals iinp and iinn, respectively. Therefore, the second paired current signals iep and ien are inverted signals of the first paired current signals iinp and iinn.

The current splitter circuit 12 generates the third paired current signals icbp and icbn from the second paired current signals iep and ien. The third paired current signals icbp and icbn may be treated as a third differential current signal. The current splitter circuit 12 includes a first output node OUT1, a second output node OUT2, and transistors Q1, Q2, Q3, and Q4. The third paired current signals icbp and icbn are output from the first output node OUT1 and the second output node OUT2, respectively. The transistor Q1 is connected between the first input node IN1 and the first output node OUT1. The transistor Q2 is connected between the first input node IN1 and the second output node OUT2. The transistor Q3 is connected between the second input node IN2 and the first output node OUT1. The transistor Q4 is connected between the second input node IN2 and the second output node OUT2. It is favorable that the transistors Q1, Q2, 03, and Q4 have the same electric characteristics as each other.

The current splitter circuit 12 adds an inverted split signal and a non-inverted split signal split from the second paired current signals iep and ien to each other according to the first control voltage Vgcp and the second control voltage Vgcn. The current splitter circuit 12 adds the inverted split signal and the non-inverted split signal to each other, to set the amplitudes of the third paired current signals icbp and icbn to be smaller than the amplitudes of the second paired current signals iep and ien.

The inverted split signal split from the second paired current signals iep and ien corresponds to a first split current icq1 output from the collector of the transistor Q1 and a fourth split current icq4 output from the collector of the transistor Q4. The non-inverted split signal split from the second paired current signals iep and ien corresponds to a second split current icq2 output from the collector of the transistor Q2 and a third split current icq3 output from the collector of the transistor Q3.

In the transistor Q1, the first control voltage Vgcp is applied to the base, the emitter is connected to the first input node IN1, and the collector is connected to the first output node OUT1. In the transistor Q2, the second control voltage Vgcn is applied to the base, the emitter is connected to the first input node IN1, and the collector is connected to the second output node OUT2. Accordingly, the current iep is split into the first split current icq1 and a second split current icq2 according to the first control voltage Vgcp and the second control voltage Vgcn. In the transistor Q3, the second control voltage Vgcn is applied to the base, the emitter is connected to the second input node IN2, and the collector is connected to the first output node OUT1. In the transistor Q4, the first control voltage Vgcp is applied to the base, the emitter is connected to the second input node IN2, and the collector is connected to the second output node OUT2. Accordingly, the current ien is split into the third split current icq3 and a fourth split current icq4 according to the first control voltage Vgcp and the second control voltage Vgcn.

The load circuit 13 includes a first load resistor element RL1 and a second load resistor element RL2. The first load resistor element RL1 is connected to the first output node OUT1, for example, between the power supply wire VCC and the first output node OUT1 (the collector of the transistor Q1). The second load resistor element RL2 is connected to the second output node OUT2, for example, between the power supply wire VCC and the second output node OUT2 (the collector of the transistor Q4). The second load resistor element RL2 has a resistance value, for example, that is equivalent to the resistance value of the first load resistor element RL1.

The current splitter circuit 12 changes the ratio of the first split current icq1 and the third split current icq3 and the ratio of the second split current icq2 and the fourth split current icq4, by the first control voltage Vgcp and the second control voltage Vgcn. The ratio of the first split current icq1 and the third split current icq3 is the basis of the current ichp as the positive-phase component of the third paired current signals icbp and icbn. The ratio of the second split current icq2 and the fourth split current icq4 is the basis of the current icbp as the reversed-phase component of the third paired current signals ichn and icbn. In more detail, by changing the ratio by which the first split current icq1 is split from the current iep and the ratio by which the third split current icq3 is split from the current ien, the current splitter circuit 12 changes the amplitude of the positive-phase output current ichp. By changing the ratio by which the second split current icq2 is split from the current iep and the ratio by which the fourth split current icq4 is split from the current ien, the current splitter circuit 12 changes the amplitude of the reversed-phase output current ichn.

The first control voltage Vgcp may be set to a value, for example, around which the transistor Q1 and the transistor Q4 are not saturated. The second control voltage Vgcn may be set to a value, for example, around which the transistor Q2 and the transistor Q3 are not saturated. In order to reduce the current gain of the differential amplitude adjuster circuit 10, the second split current icq2 and the third split current icq3 may be increased by increasing the second control voltage Vgcn, and the first split current icq1 and the fourth split current icq4 may be decreased by decreasing the first control voltage Vgcp. In order to increase the current gain of the differential amplitude adjuster circuit 10, the second split current icq2 and the third split current icq3 may be decreased by decreasing the second control voltage Vgcn, and the first split current icq1 and the fourth split current icq4 may be increased by increasing the first control voltage Vgcp. Note that, to be precise, the magnitude of each of the split currents from the first split current icq1 to the fourth split current icq4 is set according to the voltage difference between the first control voltage Vgcp and the second control voltage Vgcn. For example, if ¾ of the current iep is split into the first split current icq1; the remaining ¼ of the current iep is split into the second split current icq2; ¾ of the current ien is split into the fourth split current icq4; and the remaining ¼ of the current ien is split into the third split current icq3, then, the amplitudes of the third paired current signals icbp and icbn are ½ of the amplitudes of the second paired current signals iep and ien. For example, if ½ of the current iep is split into the first split current icq1; the remaining ½ of the current iep is split into the second split current icq2; ½ of the current ien is split into the fourth split current icq4; and the remaining ½ of the current ien is split into the third split current icq3, then, the amplitudes of the third paired current signals icbp and icbn are zero. Note that the third paired current signals ichp and icbn are inverted signals of the second paired current signals iep and ien, respectively.

The frequency characteristics of the differential amplitude adjuster circuit 10 (current splitter circuit 12) are relatively stable because the fluctuation in the operating point is, in principle, small with respect to the amplitude change. For example, the current gain can be adjusted in a state where the first split current icq1 to the fourth split current icq4 are flowing as described above, and thereby, the fluctuation in the voltage between the collector and the emitter in each of the transistors Q1 to Q4 is small, and the fluctuation in the high-frequency characteristics is suppressed. For example, by making the first control voltage Vgcp and the second control voltage Vgcn equivalent to each other, the first split current icq1 and the third split current icq3 cancel each other, and the second split current icq2 and the fourth split current icq4 cancel each other, and thereby, the current gain can be set to zero. Making the first control voltage Vgcp and the second control voltage Vgcn equivalent to each other is equivalent to setting the bases of the transistor Q1 to the transistor Q4 to the same potential.

However, compared with a two-quadrant operation circuit in which the amplitude is adjusted only by the first split current icq1 and the fourth split current icq4, the current splitter circuit 12 has a greater number of transistors connected to each of the first output node OUT1 and the second output node OUT2, and hence, the load capacitance may become greater.

In the present embodiment, the differential TIA circuit 20 whose input impedance can be set to be low is connected to the next stage of the differential amplitude adjuster circuit 10 (current splitter circuit 12). Accordingly, the differential TIA circuit 20 having the low input impedance is driven by currents output from the current splitter circuit 12 (third paired current signals icbp and icbn). Therefore, the change of the output voltage is small, and the output voltage is less likely to be affected by the load capacitance of the first output node OUT1 and the second output node OUT2. Therefore, the deterioration of the frequency characteristics of the receiver circuit 101 is suppressed, and consequently, the fluctuation in the frequency characteristics when the current gain is changed is reduced.

The differential TIA circuit 20 converts the amplitude-adjusted third paired current signals icbp and icbn into the paired voltage signals voutp and voutn. The paired voltage signals voutp and voutn may be treated as a differential voltage signal. The differential TIA circuit 20 includes a third input node IN3 and a fourth input node IN4 to which the third paired current signals icbp and icbn are input, and a first output terminal OUTP and a second output terminal OUTN that output the paired voltage signals voutp and voutn. The third input node IN3 is connected to the first output node OUT1, and the fourth input node IN4 is connected to the second output node OUT2.

The differential TIA circuit 20 further includes a transistor Q5 whose base is connected to the third input node IN3, and a transistor Q6 whose base is connected to the fourth input node IN4. The collector of the transistor Q5 is connected to the second output terminal OUTN, and the collector of the transistor Q6 is connected to the first output terminal OUTP. The emitter of the transistor Q5 and the emitter of the transistor Q6 are connected to each other and connected to the third current source 9. It is favorable that the transistors Q5 and Q6 have the same electric characteristics as each other.

The differential TIA circuit 20 further includes a first feedback resistor element RF1 connected between the third input node IN3 and the second output terminal OUTN, and a second feedback resistor element RF2 connected between the fourth input node IN4 and the first output terminal OUTP. The first feedback resistor element RF1 is connected between the base and the collector of the transistor Q5. The second feedback resistor element RF2 is connected between the base and the collector of the transistor Q6. It is favorable that the second feedback resistor element RF2 has a resistance value equivalent to the resistance value of the first feedback resistor element RF1.

It is favorable that, in a circuit in which the differential TIA circuit 20 is connected to the differential amplitude adjuster circuit 10, the respective voltage values of node voltages Va and Vb at both ends of the first feedback resistor element RF1 and node voltages Va' and Vb' at both ends of the second feedback resistor element RF2 are set to be equivalent to each other. Note that the node voltages Va, Vb, Va', and Vb' represent the average voltages (DC voltages) of the third input node IN3, the second output terminal OUTN, the fourth input node IN4, and the first output terminal OUTP, respectively. For example, in the case where the node voltages Va and Vb are different from each other, a current flowing through the first feedback resistor element RF1 may cause a voltage drop, and thereby, the operating point of the differential TIA circuit 20 may deviate from the optimum value, and the frequency characteristics may be deteriorated. In addition, the difference between the node voltages Va and Va' corresponds to the input offset of the differential amplifier circuit; therefore, the linear operation range of the differential TIA circuit 20 is narrowed.

Therefore, in the present embodiment, the average voltages of the first output node OUT1, the second output node OUT2, the first output terminal OUTP, and the second output terminal OUTN are set to be equivalent to each other. Accordingly, deviation from the optimum value of the operating point of the differential TIA circuit 20 is suppressed, and thereby, the receiver circuit 100 and the optical receiver circuit 200 that can reduce the fluctuation in the frequency characteristics when changing the current gain can be provided. The average voltage means a value obtained by averaging the instantaneous value of the voltage of a signal over a predetermined time (e.g., a time between one period and a few milliseconds). For example, the average voltage corresponds to the DC component of the voltage change of the signal.

The differential TIA circuit 20 further includes a third current source 9, a third load resistor element RL3, and a fourth load resistor element RL4. The third current source 9 supplies a constant third current (also referred to as the third constant current Ib3). The third current source 9 is connected between a common connection node at which the emitter of the transistor Q5 and the emitter of the transistor Q6 are connected to each other, and the ground wire. It is favorable that the fourth load resistor element RL4 has a resistance value equivalent to the resistance value of the third load resistor element RL3. One end of the third load resistor element RL3 is connected to the collector of the transistor Q5. One end of the fourth load resistor element RL4 is connected to the collector of the transistor Q6. The other end of the third load resistor element RL3 is connected to the other end of the fourth load resistor element RL4.

The third constant current Ib3 is set so as to be equivalent to the sum of the average current flowing through the third load resistor element RL3 and the average current flowing through the fourth load resistor element RL4. Accordingly, deviation from the optimum value of the operating point of the differential TIA circuit 20 is further suppressed, and thereby, the fluctuation in the frequency characteristics when changing the current gain can be further reduced. The average current is a value obtained by averaging the instantaneous value of the current of a signal over a predetermined time (e.g., a time between one period and a few milliseconds). For example, the average current corresponds to the DC component of the current change of the signal.

The differential TIA circuit 20 further includes a fifth load resistor element RC. The fifth load resistor element RC has its one end connected to the other end of the third load resistor element RL3 and the other end of the fourth load resistor element RL4, and has the other end connected to the power supply wire VCC. The node voltages Vb and Vb' can be set to desired values by the resistance value of the fifth load resistor element RC.

In order to make the node voltages Va, Vb, Va', and Vb' equivalent to each other, the voltage drops through the load resistor elements RL1, RL2, RL3, and RL4 are made to be equivalent to each other. In other words, it is favorable that the current values of the first constant current Ib1, the second constant current Ib2, and the third constant current Ib3 are set so as to satisfy a conditional expression "RL1× Ib1=RL2×Ib2=RC×Ib3+RL3×Ib3/2=RC×Ib3+RL4×Ib3/2. In addition, in order to reduce the influence of fluctuations in temperature and power supply voltage, the receiver circuit 101 may have a compensation function for environmental fluctuations in the first constant current Ib1, the second constant current Ib2, and the third constant current Ib3.

Meanwhile, when the first paired current signals iinp and iinn input into the differential amplitude adjuster circuit 10 include DC components, offset currents are generated in the third paired current signals icbp and icbn due to the DC components, and a voltage difference (offset voltage) is generated between the node voltage Va and the node voltage Va'. The DC components are removed by the current pull-out circuit 30 that causes the first feedback current Iaocp and the second feedback current Iaocn to flow according to the first feedback control voltage Vaocp and the second feedback control voltage Vaocn, and the offset voltage between the node voltage Va and the node voltage Va' is suppressed. Accordingly, the fluctuation in the frequency characteristics of the receiver circuit 101 when changing the current gain can be further reduced.

Figure 3:
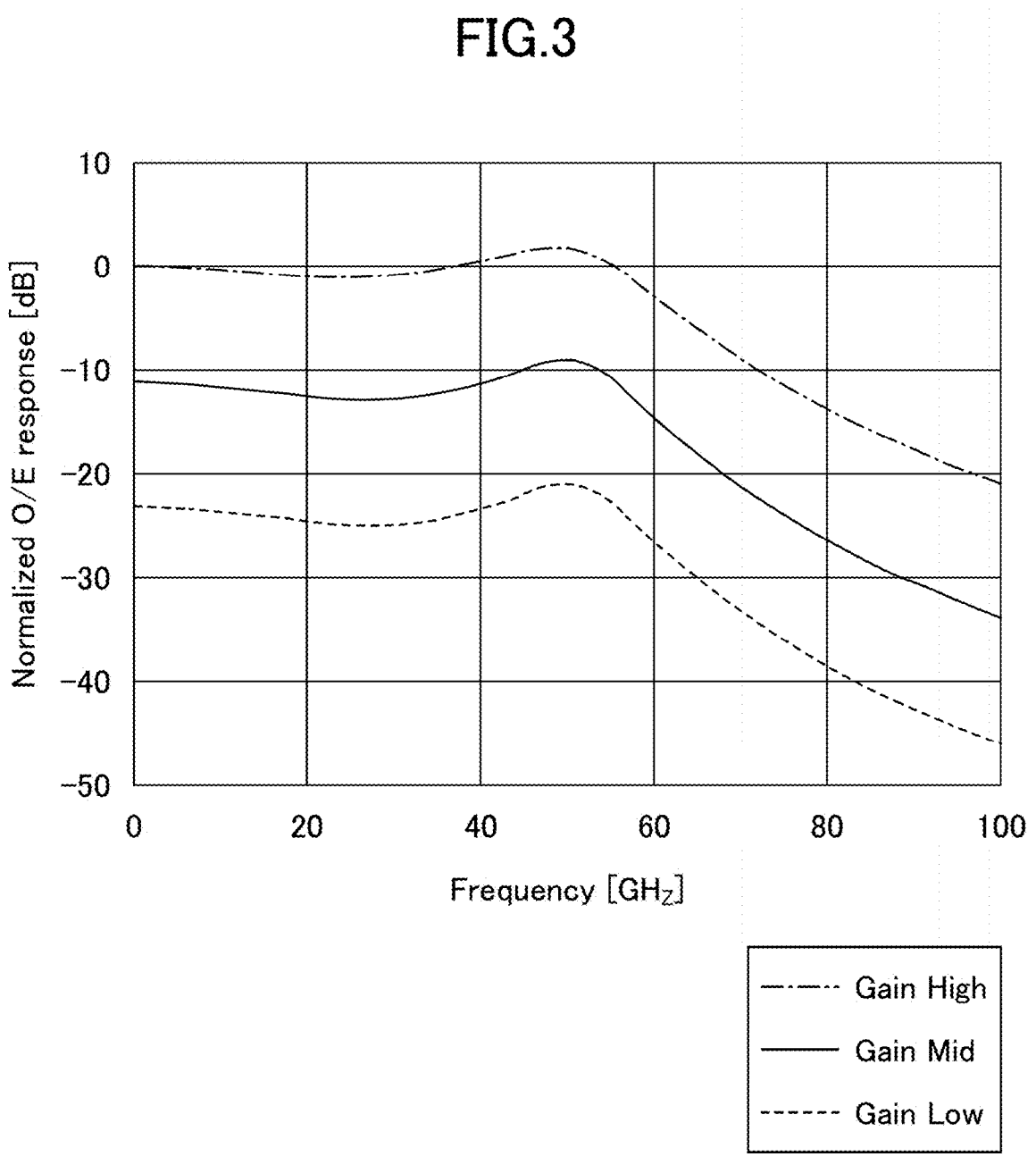
FIG. 3 is a diagram illustrating frequency characteristics of the O/E response of an optical receiver circuit.
Figure 4:
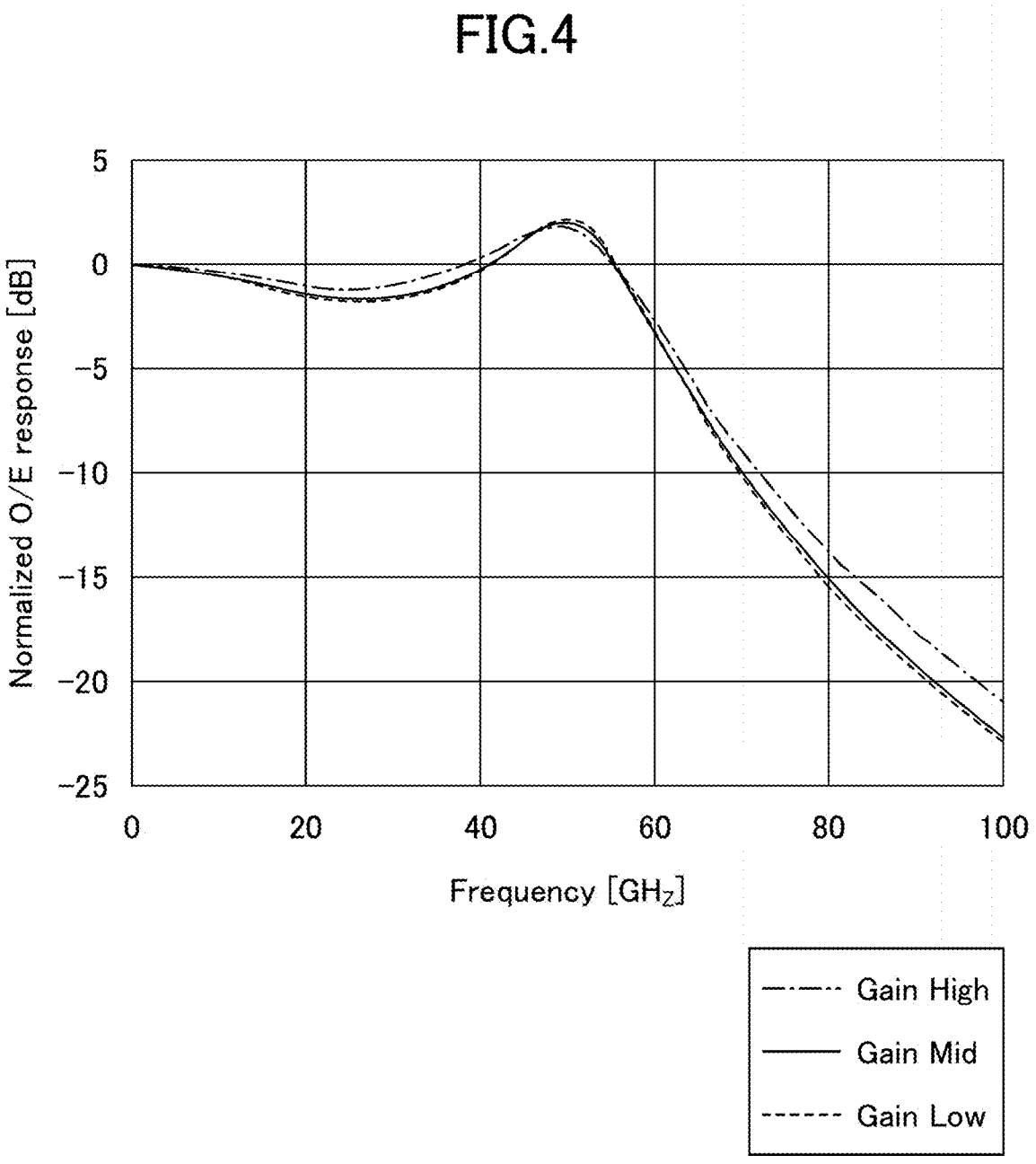
FIG. 4 is a diagram illustrating frequency characteristics of the O/E response of an optical receiver circuit.

FIGS. 3 and 4 illustrate frequency characteristics of the O/E response determined by a circuit simulation (O/E: Optical signal/Electrical signal). By fixing the first control voltage Vgcp and adjusting the second control voltage Vgcn, the current gain was changed to three levels of high gain High, mid gain Mid, and low gain Low. As described above, as the current gain becomes smaller, the amplitudes of the third paired current signals icbp and icbn become smaller, and the amplitudes of the paired voltage signals voutp and voutn become smaller.

The vertical axis in FIG. 3 represents the normalized gain value for the respective levels, using the gain value of the high gain High at 1 GHz as a reference value. According to FIG. 3, a variable width of gain of 20 dB or greater is obtained between the high gain High and the low gain Low. The vertical axis in FIG. 4 represents the normalized gain value for the respective levels, using the gain values at 1 GHz in the levels of the high gain High, mid gain Mid, and low gain Low as reference values. According to FIG. 4, it can be understood that the frequency characteristics in the levels of the high gain High, mid gain Mid, and low gain Low almost overlap, and there is little fluctuation in the frequency characteristics due to the change in gain. In other words, the fluctuation in the frequency characteristics when changing the current gain is suitably reduced.

Figure 5:
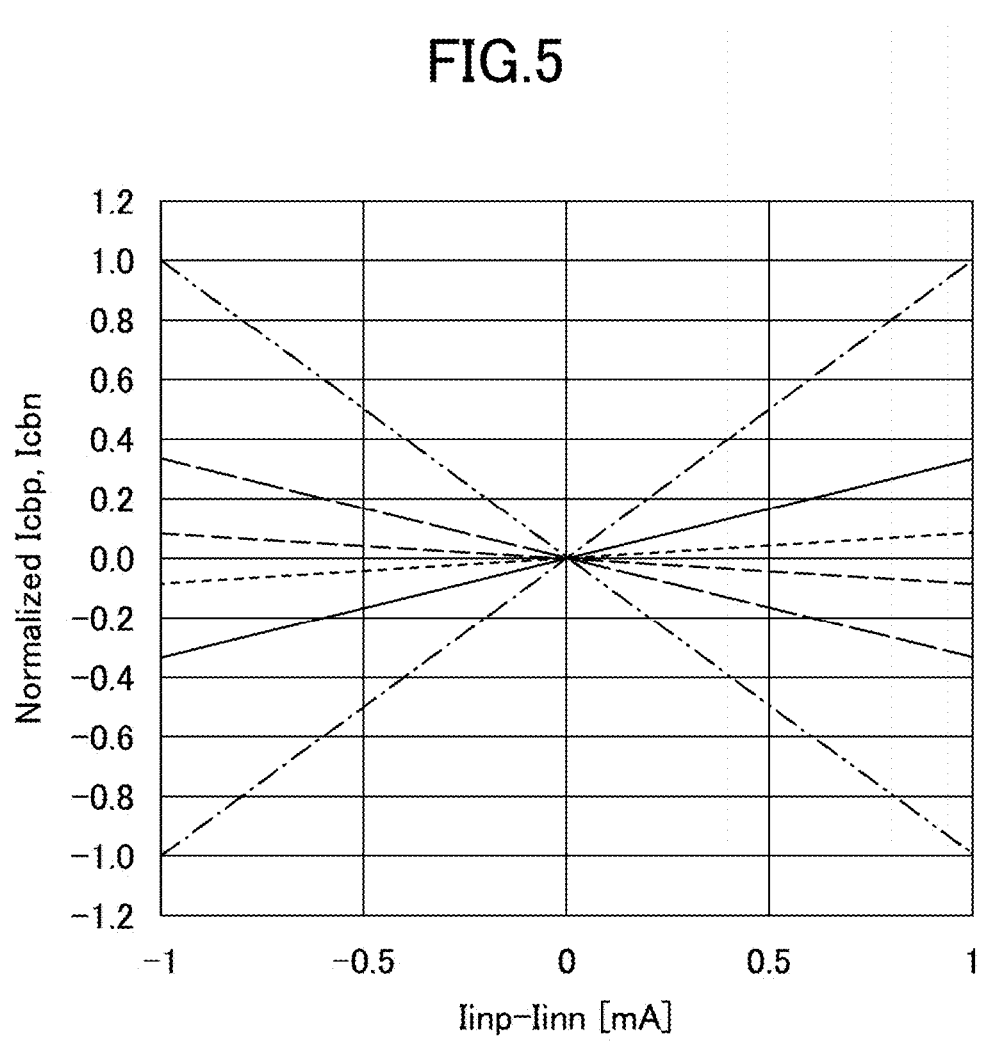
FIG. 5 is a graph illustrating input/output characteristics of a differential amplitude adjuster circuit.
Figure 6:
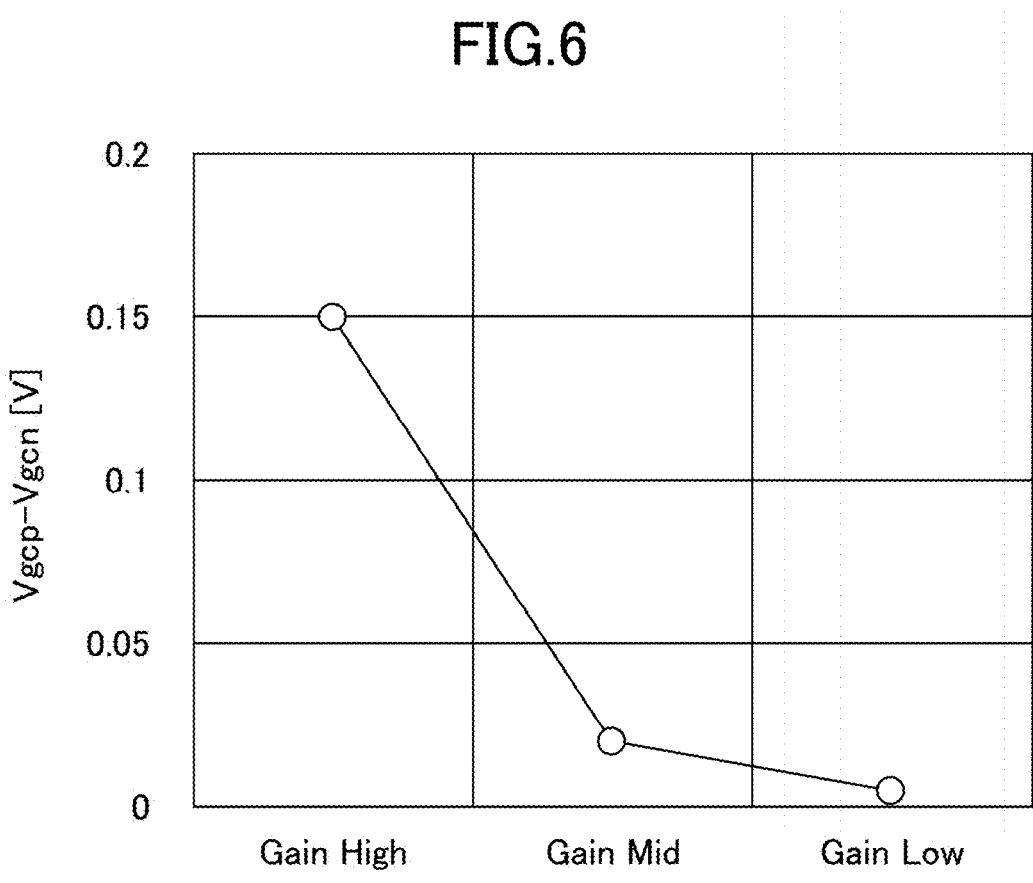
FIG. 6 is a diagram illustrating gain-controlled voltages Vgcp-Vgcn for the respective gain settings in FIG. 5.

FIG. 5 illustrates input/output characteristics of the differential amplitude adjuster circuit 10 in a DC operation. The graph illustrates changes in the positive-phase output current Icbp and the reversed-phase output current Icbn when sweeping a difference Iinp-Iinn between the first input current Iinp and the second input current Iinn from −1 mA to +1 mA. Note that the first input current Iinp, the second input current Iinn, the positive-phase output current Icbp, and the reversed-phase output current Ichn all represent DC currents. On the vertical axis, the magnitude of the positive-phase output current Ichp and the reversed-phase output current Ichn at a maximum gain (high gain) is set to 1. FIG. 5 illustrates results of changing the gain setting to the three levels of the high gain High, mid gain Mid, and low gain Low. According to FIG. 5, by changing the gain setting, the voltage difference between the positive-phase output current Icbp and the reversed-phase output current Icbn is adjusted. Although FIG. 5 illustrates a relationship between the input signal and the output signal in the DC operation, substantially the same relationship holds between the first paired current signals iinp and iinn and the third paired current signals ichp and ichn. FIG. 6 illustrates the voltage difference between the first control voltage Vgcp and the second control voltage Vgcn in the respective gain settings in FIG. 5. In the respective gain settings in FIG. 5, the first control voltage Vgcp is fixed, and the second control voltage Vgcn is changed so that the voltage difference becomes the values illustrated in FIG. 6. As described above, the current gain is set according to the difference voltages Vgcp-Vgcn, not according to the individual voltage values of the first control voltage Vgcp and the second control voltage Vgcn.

Figure 7:
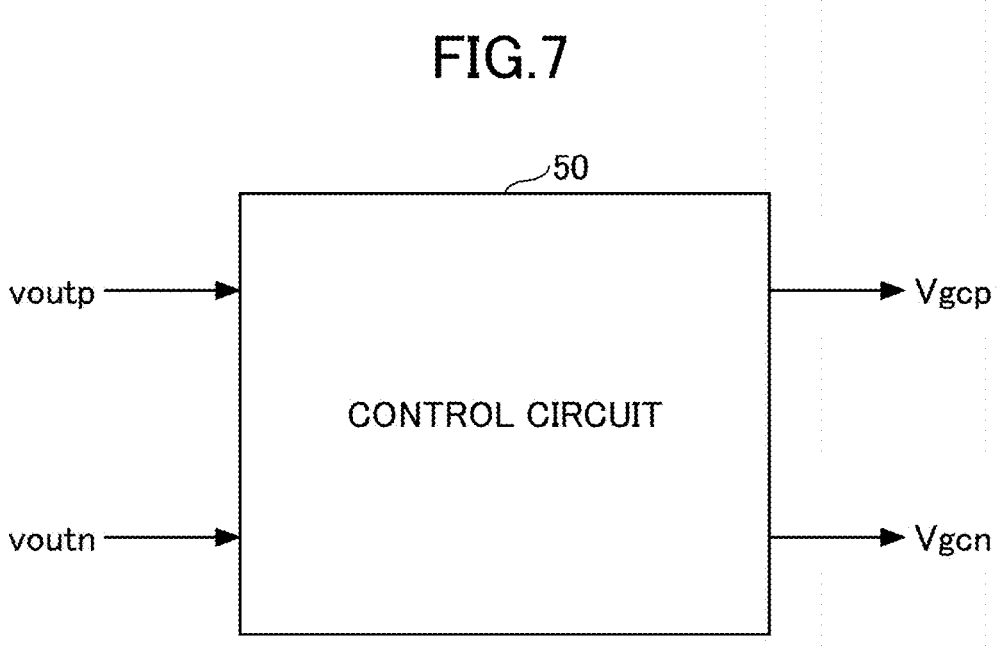
FIG. 7 is a diagram illustrating a control circuit that controls the gain of a differential amplitude adjuster circuit 10.

FIG. 7 is a diagram illustrating a control circuit that controls the gain of the differential amplitude adjuster circuit 10. The control circuit 50 detects, for example, the amplitudes of the paired voltage signals voutp and voutn, and according to the detection results, generates the first control voltage Vgcp and the second control voltage Vgcn. The control circuit 50 may be a circuit provided inside the receiver circuit 100, or may be a circuit provided outside the receiver circuit 100. In the case where the control circuit 50 is provided outside the receiver circuit 100, for example, the control circuit 50 is connected to the first output terminal OUTP and the second output terminal OUTN of the receiver circuit 100, and supplies the generated first control voltage Vgcp and second control voltage Vgcn to the receiver circuit 100.

Figure 8:
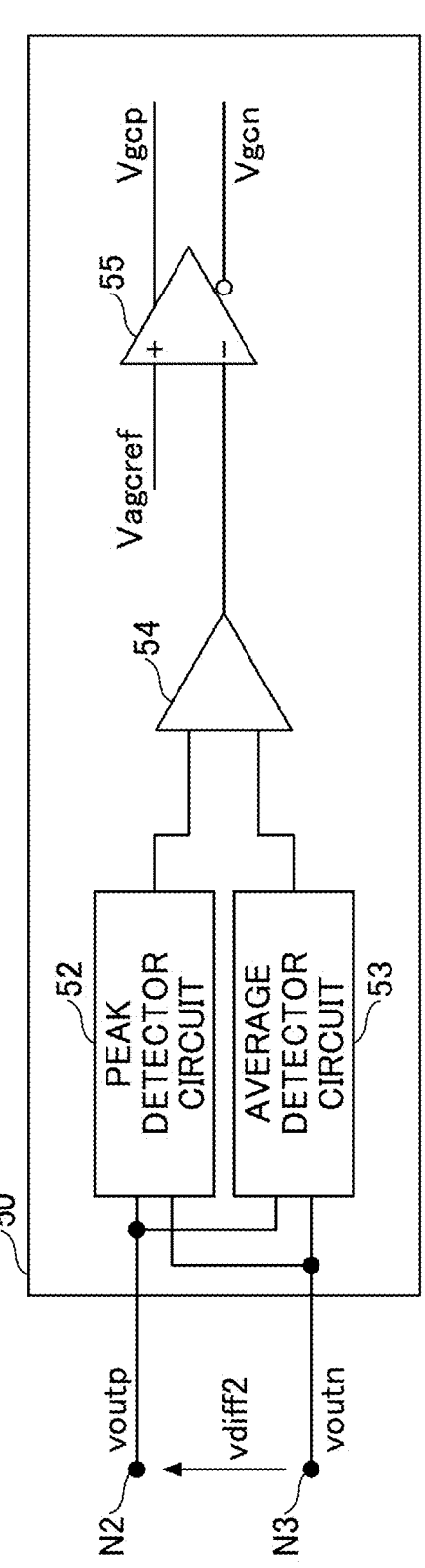
FIG. 8 illustrates an example of a configuration of the control circuit.

FIG. 8 illustrates an example of a configuration of the control circuit. The control circuit 50 includes a peak detector circuit 52, an average detector circuit 53, an amplifier 54, and a differential amplifier circuit 55. The control circuit 50 includes a node N2 and a node N3 for receiving the paired voltage signals voutp and voutn. For example, the first voltage signal voutp is input into the node N2, and the second voltage signal voutn is input into the node N3.

The peak detector circuit 52 detects a peak value of the voltage difference (voltage vdiff2) between the first voltage signal voutp and the second voltage signal voutn, and outputs a voltage having a magnitude corresponding to the detected peak value. The peak detector circuit 52 holds the output voltage if there is no change in the detected peak value. The average detector circuit 53 detects an average value (magnitude of the DC component) of the voltage vdiff2 with respect to time, and outputs a voltage having a magnitude corresponding to the detected average value. The amplifier 54 outputs a voltage (half of the amplitude value of the voltage vdiff2) according to the difference between the output voltage of the peak detector circuit 52 and the output voltage of the average detector circuit 53. Therefore, the voltage output by the amplifier 54 is a voltage according to the amplitude value of the voltage vdiff2. The amplifier 54 may be, for example, an operational amplifier or a differential amplifier circuit. Note that the peak detector circuit 52 may detect peak values of the first voltage signal voutp and the second voltage signal voutn, and the average detector circuit 53 may detect average values of the first voltage signal voutp and the second voltage signal voutn. Accordingly, the voltage output by the amplifier 54 is a voltage according to the amplitude values of the first voltage signal voutp and the second voltage signal voutn. The amplitude values of the first voltage signal voutp and the second voltage signal voutn are half the amplitude value of the voltage vdiff2.

The differential amplifier circuit 55 compares the voltage output by the amplifier 54 with a reference voltage Vagcref. When the voltage output by the amplifier 54 is lower than the reference voltage Vagcref, the differential amplifier circuit 55 increases the first control voltage Vgcp and decreases the second control voltage Vgcn, to increase the gain of the receiver circuit 101 (increase the amplitude of the positive-phase output current ichp and the reversed-phase output current ichn). Meanwhile, when the voltage output by the amplifier 54 is higher than the reference voltage Vagcref, the differential amplifier circuit 55 decreases the first control voltage Vgcp and increases the second control voltage Vgcn, to decrease the gain of the receiver circuit 101 (decrease the amplitude of the positive-phase output current icbp and the reversed-phase output current icbn). Accordingly, the amplitudes of the paired voltage signals voutp and voutn are limited so as not to be greater than a value set according to the reference voltage Vagcref. Note that, regarding the "gain" referred to in the above description, the amplitudes of the third paired current signals icbp and icbn are set to be equivalent to or smaller than the amplitudes of the first paired current signals iinp and iinn. The amplitude of the first paired current signals iinp and iinn corresponds to the amplitude of the difference (difference current) between the first input current iinp and the second input current iinn. The amplitude of the third paired current signals icbp and icbn corresponds to the difference (difference current) between the positive-phase output current icbp and the reversed-phase output current icpn.

Figure 9:
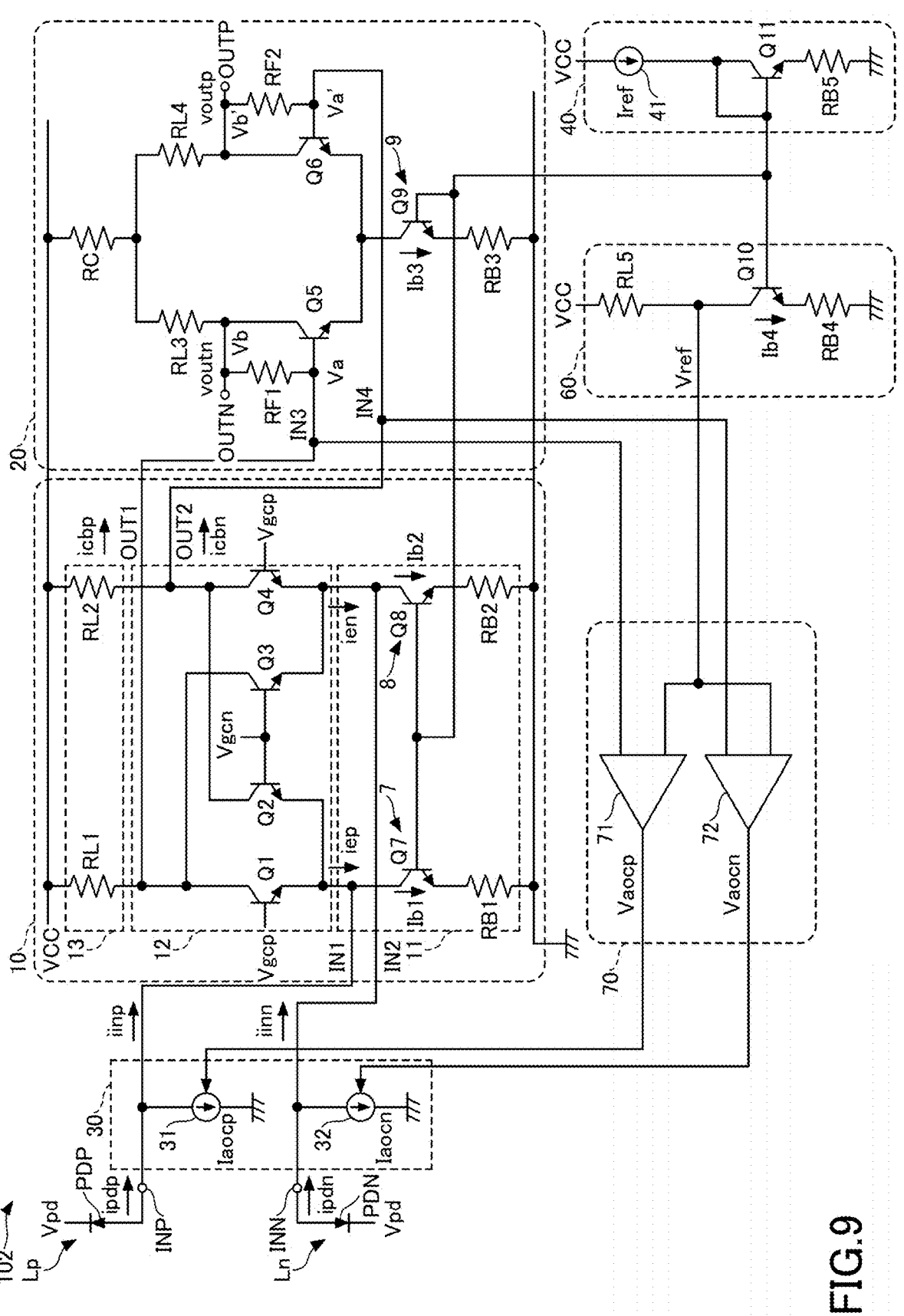
FIG. 9 is a diagram illustrating an example of a configuration of a receiver circuit according to a second embodiment.

FIG. 9 is a diagram illustrating an example of a configuration of a receiver circuit according to a second embodiment. In the second embodiment, description of substantially the same elements, operations, and effects as in the first embodiment are omitted or simplified by referring to the above description. A receiver circuit 102 illustrated in FIG. 9 is an example of the receiver circuit 100 (FIG. 1).

In FIG. 9 (second embodiment), the first current source 7, the second current source 8, and the third current source 9 are illustrated by transistors and resistors, respectively, in contrast to FIG. 2 (first embodiment). In addition, a reference current circuit 40 that supplies a base voltage and a base current of the transistors of the first current source 7, the second current source 8, and the third current source 9 is illustrated. In addition, an AOC (Automatic Offset Control) circuit 70 that generates the first feedback control voltage Vaocp and the second feedback control voltage Vaocn by two operational amplifiers 71 and 72 is illustrated. The AOC circuit 70 is an example of a feedback control circuit. In addition, a reference voltage circuit 60 that generates a reference voltage Vref for the AOC circuit 70 is illustrated. The base voltage (input voltage) of the reference voltage circuit 60 is supplied from the reference current circuit 40.

The receiver circuit 102 further includes the reference current circuit 40, the reference voltage circuit 60, and the AOC circuit 70.

The reference current circuit 40 generates a reference current Iref. The reference current circuit 40 includes a series circuit of a current source 41, a transistor Q11, and a resistor RB5. The first current source 7 includes a first transistor Q7 that supplies the first constant current Ib1, and a resistor RB1 that is connected in series to the emitter of the first transistor Q7. The second current source 8 includes a second transistor Q8 that supplies the second constant current Ib2, and a resistor RB2 that is connected in series to the emitter of the second transistor Q8. The third current source 9 includes a third transistor Q9 that supplies the third constant current Ib3, and a resistor RB3 that is connected in series to the emitter of the third transistor Q9. The reference current circuit 40 supplies base voltages and base currents to the bases of the first transistor Q7, the second transistor Q8, and the third transistor Q9, for example, so as to make changes of the first constant current Ib1, the second constant current Ib2, and the third constant current Ib3 with respect to the temperature or power supply voltage equivalent to the changes of the reference current Iref with respect to the temperature or power supply voltage.

Each of the first transistor Q7, the second transistor Q8, and the third transistor Q9 supplying the first constant current Ib1, the second constant current Ib2, and the third constant current Ib3, together with the reference current circuit 40, forms a current mirror circuit. In more detail, the reference current circuit 40 together with the first current source 7 forms the current mirror circuit. Accordingly, the first constant current Ib1 can be set to a magnitude proportional to the magnitude of the reference current Iref. For example, when the first transistor Q7 is formed to have the same configuration as the configuration of the transistor Q11, the constant of proportionality can be set by the ratio between the size of the first transistor Q7 and the size of the transistor Q11. Similarly, the reference current circuit 40 forms a current mirror circuit together with each of the second current source 8 and the third current source 9. Accordingly, each of the second constant current Ib2 and the third constant current Ib3 can be set to a magnitude proportional to the magnitude of the reference current Iref. Accordingly, by satisfying the above conditional expression, the node voltages Va, Vb, Va', and Vb' are adjusted so as to be equivalent to each other, and thereby, the fluctuation in the frequency characteristics when changing the current gain can be reduced.

The AOC circuit 70 controls the magnitudes of the first feedback current Iaocp and the second feedback current Iaocn so that each of the node voltage Va of the third input node IN3 and the node voltage Va' of the fourth input node IN4 is equivalent to the reference voltage Vref. The reference voltage Vref is equivalent to the node voltages Va and Va' when there is no DC input in the differential amplitude adjuster circuit 10. Therefore, by controlling the magnitudes of the first feedback current Iaocp and the second feedback current Iaocn so that each of the node voltage Va of the third input node IN3 and the node voltage Va' of the fourth input node IN4 is equivalent to the reference voltage Vref, only the AC component is input into the differential amplitude adjuster circuit 10. The AOC circuit 70 generates the first feedback control voltage Vaocp and the second feedback control voltage Vaocn by negative feedback control according to the respective differences between the node voltages Va and Va' and the reference voltage Vref. Accordingly, the node voltages Va and Va' are maintained at the reference voltage Vref. By the operations of the AOC circuit 70 and the current pull-out circuit 30, the DC currents of the first photodetector element PDP and the second photodetector element PDN are controlled so as not to be input, and the deviation of the operating point of the differential amplitude adjuster circuit 10 from the optimum state is reduced. Accordingly, the fluctuation in the frequency characteristics when changing the current gain can be reduced.

The gains of the operational amplifiers 71 and 72 simply need to be great enough, for example, around several thousand, which is the gain of a typical operational amplifier.

By forming a current mirror circuit with the reference current circuit 40, the reference voltage circuit 60 generates a current (also referred to as the fourth constant current Ib4). All of the respective current sources supplying the first constant current Ib1, the second constant current Ib2, the third constant current Ib3, and the fourth constant current Ib4 change the first constant current Ib1, the second constant current Ib2, the third constant current Ib3, and the fourth constant current Ib4 in the same direction according to the fluctuation in temperature or power supply voltage. Accordingly, mutual deviation of the node voltages Va, Vb, Va', and Vb' is prevented.

Figure 10:
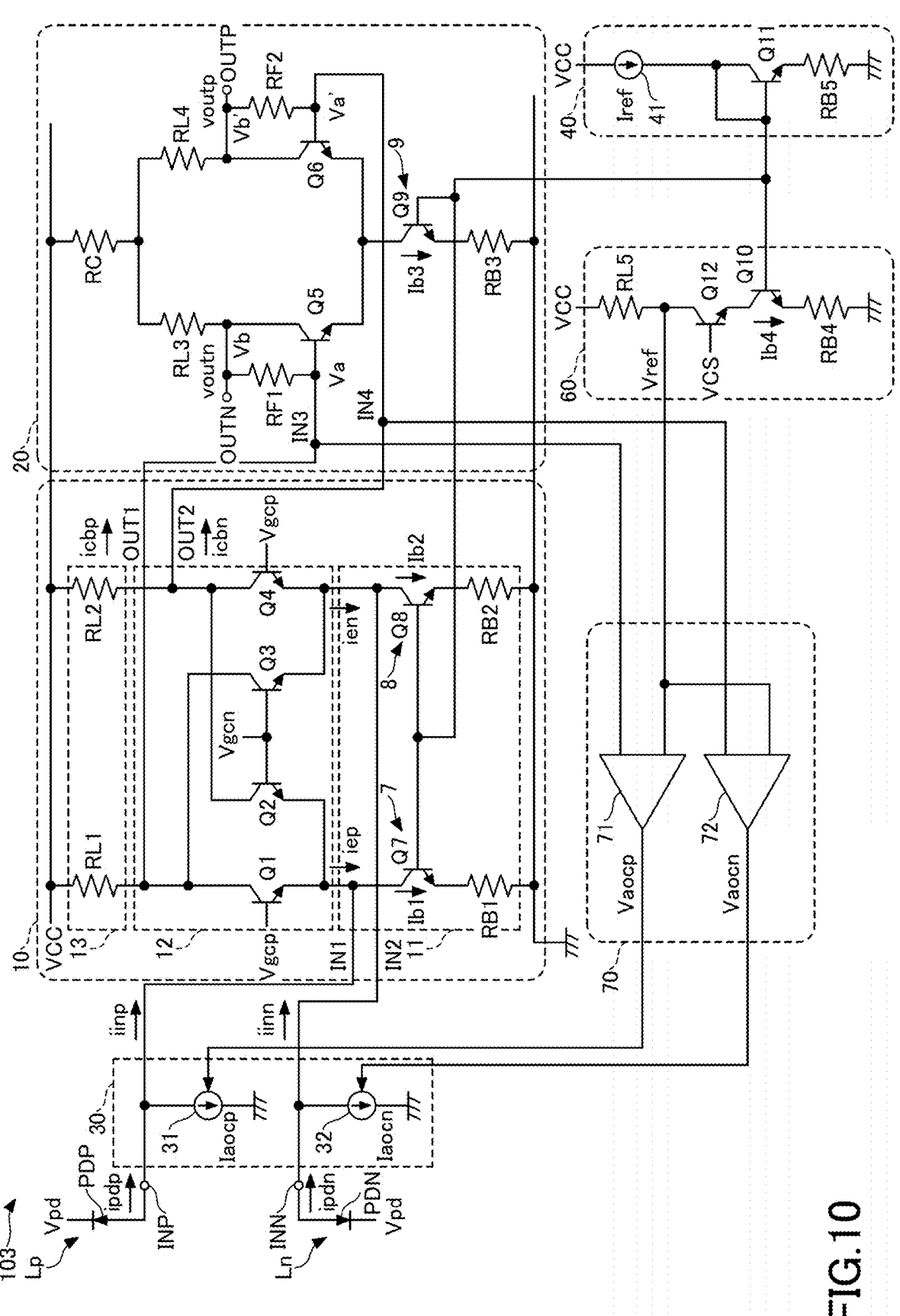
FIG. 10 is a diagram illustrating an example of a configuration of a receiver circuit according to a third embodiment.

FIG. 10 is a diagram illustrating an example of a configuration of a receiver circuit according to a third embodiment. In the third embodiment, description of substantially the same elements, operations, and effects as in the first and second embodiments are omitted or simplified by referring to the above description. A receiver circuit 103 illustrated in FIG. 10 is an example of the receiver circuit 100 (FIG. 1).

In the reference voltage circuit 60 in FIG. 10 (third embodiment), a transistor Q12 is added to the reference voltage circuit 60 in FIG. 9 (second embodiment). In more detail, the collector of the transistor Q12 is connected to the load resistor element RL5, and the emitter of the transistor Q12 is connected to the collector of the transistor Q10. The reference voltage Vref is generated at the collector of the transistor Q12. By adding the transistor Q12, the connection configuration between the power supply wire VCC and the ground in the reference voltage circuit 60 matches the connection configuration between the power supply wire VCC and the ground in the differential amplitude adjuster circuit 10. In other words, the load resistor element RL5 corresponds to the load resistor element RL2, the transistor Q12 corresponds to the transistor Q4, the transistor Q10 corresponds to the transistor Q8, and the resistor RB4 corresponds to the resistor RB2. In this way, by matching both circuit configurations with each other, movement of the reference voltage Vref and the node voltages Va and Va' in response to the fluctuation in temperature or power supply voltage can be matched, and hence, compensation operations can be executed with high accuracy. Accordingly, the fluctuation in the frequency characteristics when changing the gain can be more reduced.

In the configuration in FIG. 10, the current splitter circuit 12 includes the transistor Q1 connected to the collector of the transistor Q7 and the transistor Q4 connected to the collector of the transistor Q8. The transistor Q1 is an example of a fourth transistor. The transistor Q4 is an example of a fifth transistor. Meanwhile, the reference voltage circuit 60 includes the transistor Q10 whose base is connected to the bases of the transistors Q7, 08, and 09, and the transistor Q12 connected to the collector of the transistor Q10. The transistor Q10 is an example of a sixth transistor. The transistor Q12 is an example of a seventh transistor. Accordingly, the reference voltage circuit 60 has the same connection configuration between the power supply wire VCC and the ground as the connection configuration between the power supply wire VCC and the ground in the differential amplitude adjuster circuit 10.

In addition, in the configuration in FIG. 10, the load circuit 13 includes the first load resistor element RL1 connected to the collector of the transistor Q1 and the second load resistor element RL2 connected to the collector of the transistor Q4. The constant current circuit 11 includes the resistor RB1 connected to the emitter of the transistor Q7 and a resistor RB2 connected to the emitter of the transistor Q8. Meanwhile, the reference voltage circuit 60 includes the load resistor element RL5 connected to the collector of the transistor Q12 and the resistor RB4 connected to the emitter of the transistor Q10. Accordingly, the reference voltage circuit 60 has the same connection configuration between the power supply wire VCC and the ground as the connection configuration between the power supply wire VCC and the ground in the differential amplitude adjuster circuit 10.

What is claimed is:

1. A receiver circuit comprising:

a constant current circuit that includes a first input node and a second input node into which first paired current signals are input, a first current source connected to the first input node, and a second current source connected to the second input node, wherein the receiver circuit is configured to generate second paired current signals according to the first paired current signals;

a current splitter circuit configured to generate third paired current signals from the second paired current signals, wherein the current splitter circuit includes a first output node and a second output node configured to output the third paired current signals, and sets an amplitude of the third paired current signals to be smaller than an amplitude of the second paired current signals, by adding an inverted split signal and a non-inverted split signal split from the second paired current signals according to a first control voltage and a second control voltage together;

a load circuit that includes a first load resistor element and a second load resistor element, wherein the first load resistor element is connected to the first output node and the second load resistor element is connected to the second output node; and a differential transimpedance amplifier circuit that includes a third input node and a fourth input node into which the third paired current signals are input, a first output terminal and a second output terminal configured to output paired voltage signals, a first feedback resistor element connected between the third input node and the second output terminal, and a second feedback resistor element connected between the fourth input node and the first output terminal, wherein the differential transimpedance amplifier circuit is configured to generate the paired voltage signals according to the third paired current signals, and wherein average voltages of the first output node, the second output node, the first output terminal, and the second output terminal are set to be equivalent to each other.

2. The receiver circuit as claimed in claim 1, wherein the first current source supplies a first current, wherein the second current source supplies a second current, wherein the second current has a current value that is equivalent to a current value of the first current, wherein the second load resistor element has a resistance value equivalent to a resistance value of the first load resistor element, wherein the differential transimpedance amplifier circuit further includes a third current source, a third load resistor element, and a fourth load resistor element, wherein the third current source supplies a third current, wherein the fourth load resistor element has a resistance value equivalent to a resistance value of the third load resistor element, and wherein the third current is equivalent to a sum of an average current flowing through the third load resistor element and an average current flowing through the fourth load resistor element.

3. The receiver circuit as claimed in claim 2, wherein the differential transimpedance amplifier circuit further includes a fifth load resistor element, and wherein the fifth load resistor element has one end connected to the third load resistor element and the fourth load resistor element, and has another end connected to a power supply wire.

4. The receiver circuit as claimed in claim 1, further comprising:

a first input terminal into which a first current signal is input;

a second input terminal into which a second current signal is input; and a current pull-out circuit configured to generate the first paired current signals by pulling out a first direct current from the first current signal and pulling out a second direct current from the second current signal.

5. The receiver circuit as claimed in claim 4, further comprising:

a reference voltage circuit configured to generate a reference voltage; and a feedback control circuit configured to control pulling out the first direct current and the second direct current so as to make a voltage of the third input node and a voltage of the fourth input node equivalent to the reference voltage.

6. The receiver circuit as claimed in claim 5, wherein the first current source includes a first transistor configured to supply the first current, wherein the second current source includes a second transistor configured to supply the second current, wherein the current splitter circuit includes a fourth transistor connected to a collector of the first transistor and a fifth transistor connected to a collector of the second transistor, and wherein the reference voltage circuit includes a sixth transistor whose base is connected to bases of the first transistor and the second transistor, and a seventh transistor connected to a collector of the sixth transistor.

7. The receiver circuit as claimed in claim 2, further comprising:

a reference current circuit configured to generate a reference current, wherein the first current source includes a first transistor configured to supply the first current, wherein the second current source includes a second transistor configured to supply the second current, wherein the third current source includes a third transistor configured to supply the third current, and wherein the reference current circuit supplies currents to bases of the first transistor, the second transistor, and the third transistor so as to make changes in the first current, the second current, and the third current with respect to temperature or power supply voltage, equivalent to change in the reference current with respect to the temperature or the power supply voltage.

8. An optical receiver circuit comprising:

a first photodetector element configured to generate a first current signal according to a first optical signal;

a second photodetector element configured to generate a second current signal according to a second optical signal; and the receiver circuit as claimed in claim 1 that includes a first input terminal to which the first photodetector element is connected, and a second input terminal to which the second photodetector element is connected.

* * * * *